(12) United States Patent
Parbhoo et al.

(10) Patent No.: US 8,236,705 B2
(45) Date of Patent: Aug. 7, 2012

(54) DEPOSITION OF VISCOUS MATERIAL

(75) Inventors: Nitin H. Parbhoo, Wappingers Falls, NY (US); Spyridon Skordas, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 39 days.

(21) Appl. No.: 12/843,123

(22) Filed: Jul. 26, 2010

(65) Prior Publication Data

US 2012/0021609 A1    Jan. 26, 2012

(51) Int. Cl.
*H01L 21/469* (2006.01)
(52) U.S. Cl. ........ 438/763; 438/758; 438/778; 438/780; 438/782; 427/240; 427/447; 427/255; 427/532; 257/626; 257/632; 257/E21.029; 118/55; 118/111; 118/232; 118/255; 118/263; 118/402; 118/403; 118/409; 118/627; 118/668; 118/679
(58) Field of Classification Search .................. None
See application file for complete search history.

(56) References Cited

U.S. PATENT DOCUMENTS

| | | | |
|---|---|---|---|
| 5,919,520 A | 7/1999 | Tateyama et al. | |
| 6,033,728 A | 3/2000 | Kikuchi et al. | |
| 6,319,317 B1 | 11/2001 | Takamori | |
| 6,884,294 B2 | 4/2005 | Minami et al. | |
| 7,371,434 B2 | 5/2008 | Ito | |
| 2009/0191720 A1 | 7/2009 | Nakagawa | |
| 2009/0291198 A1* | 11/2009 | Yoshihara et al. | 427/8 |
| 2009/0317546 A1 | 12/2009 | Winter et al. | |

* cited by examiner

*Primary Examiner* — Charles Garber
*Assistant Examiner* — Yasser Abdelaziez
(74) *Attorney, Agent, or Firm* — Hoffman Warnick LLC; Catherine Ivers

(57) ABSTRACT

Embodiments of the invention provide methods and systems for depositing a viscous material on a substrate surface. In one embodiment, the invention provides a method of depositing a viscous material on a substrate surface, the method comprising: applying a pre-wet material to a surface of a substrate; depositing a viscous material atop the pre-wet material; rotating the substrate about an axis to spread the viscous material along the surface of the substrate toward a substrate edge; and depositing additional pre-wet material in a path along the surface and adjacent the spreading viscous material.

17 Claims, 4 Drawing Sheets

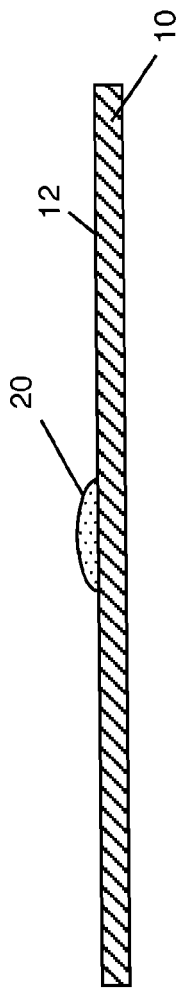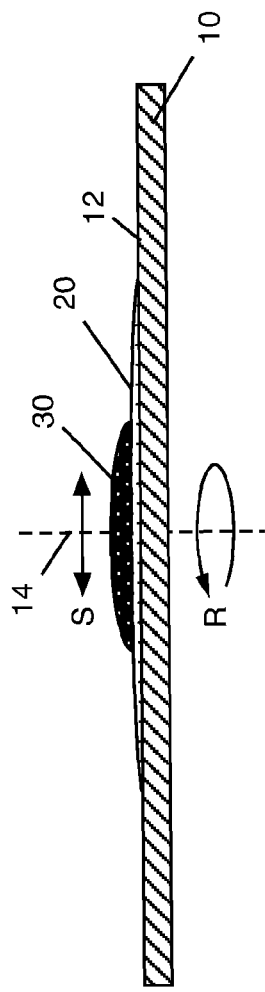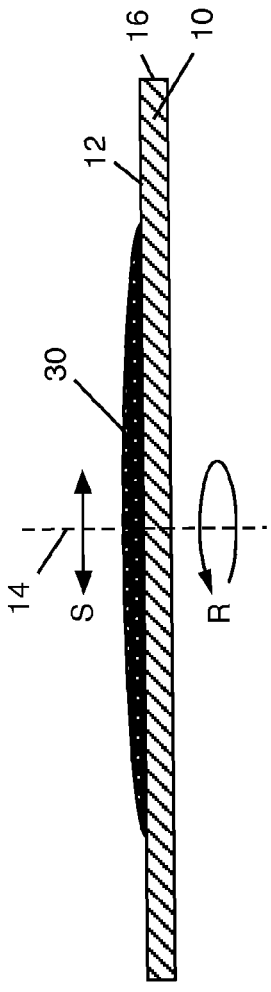

DEPOSITION OF VISCOUS MATERIAL

BACKGROUND

The manufacture of modern semiconductor devices typically involves the deposition of viscous materials, such as polyamides, to substrates. Often, such deposition involves spin coating, in which a substrate is rapidly rotated about its axis such that centrifugal force spreads a deposited material along the substrate surface.

Many materials so deposited have a high viscosity, requiring high spin coating speeds of about 4000 rpm or higher. At such high speeds, pre-wet materials, meant to facilitate the spread of a viscous material, often spread much more quickly than the viscous material and/or evaporate, leaving the viscous material to spread along a dry surface of the substrate. An additional difficulty is the large size of modern semiconductor substrates, which increases not only the extent to which the viscous material must spread, but also the rate and degree to which pre-wet materials are lost before the viscous material has fully spread.

SUMMARY

Embodiments of the invention provide methods and systems for depositing a viscous material on a substrate surface.

One aspect of the invention provides a method of depositing a viscous material on a substrate surface, the method comprising: applying a pre-wet material to a surface of a substrate; depositing a viscous material atop the pre-wet material; rotating the substrate about an axis to spread the viscous material along the surface of the substrate toward a substrate edge; and depositing additional pre-wet material in a path along the surface and adjacent the spreading viscous material.

Another aspect of the invention provides a method of depositing a viscous material on a semiconductor wafer surface, the method comprising: applying a pre-wet material to a surface of a semiconductor wafer; depositing a viscous material atop the pre-wet material; rotating the semiconductor wafer about an axis to spread the viscous material along the surface and toward an edge of the semiconductor wafer; depositing additional pre-wet material in a substantially radial path along the surface to continuously maintain a pre-wet pool adjacent the spreading viscous material.

Still another aspect of the invention provides a system for depositing a viscous material on a semiconductor wafer, the system comprising: an applicator that applies a pre-wet material to a surface of the semiconductor wafer; a deposition system that deposits a viscous material atop the pre-wet material; a rotation system that rotates the semiconductor wafer about an axis; and an applicator that deposits additional pre-wet material in a path along the surface and adjacent the spreading viscous material.

The illustrative aspects of the present invention are designed to solve the problems herein described and other problems not discussed, which are discoverable by a skilled artisan.

BRIEF DESCRIPTION OF THE SEVERAL VIEWS OF THE DRAWINGS

These and other features of this invention will be more readily understood from the following detailed description of the various aspects of the invention taken in conjunction with the accompanying drawings that depict various embodiments of the invention, in which:

FIGS. 1-3 show cross-sectional schematic views of the deposition of a viscous material by spin coating;

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 4:
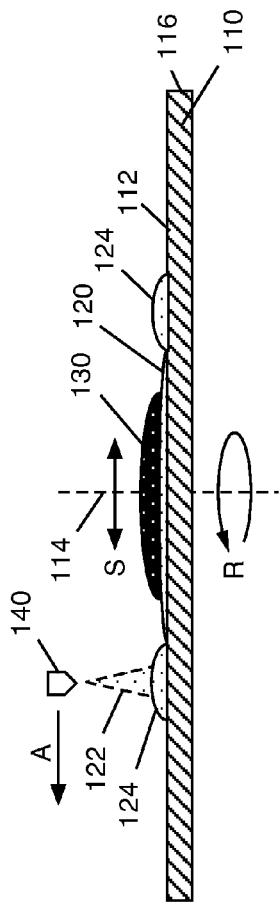
FIGS. 4-7 show cross-sectional schematic views of the deposition of a viscous material according to an embodiment of the invention.

FIGS. 1-3 show cross-sectional schematic views of the application of a viscous material to a semiconductor wafer. In FIG. 1, a pre-wet material 20 is applied to a surface 12 of a semiconductor wafer 10. A viscous material 30 is deposited atop pre-wet material 20 and semiconductor wafer 10 is rotated R about an axis 14. Rotating semiconductor wafer 10 causes both pre-wet material 20 and viscous material 30 to spread S out from axis 14.

The lower viscosity of pre-wet material 20 causes it to spread S more rapidly than viscous material 30, which has a relatively higher viscosity. That is, pre-wet material 20 spreads at a rate higher than the rate at which viscous material 30 spreads. As a consequence, pre-wet material 20 will often have spread completely from axis 14, leaving viscous material 30 without any pre-wet material 20 beneath or adjacent it, as shown in FIG. 3. The loss of pre-wet material 20 beneath or adjacent viscous material 30 is often sped and more extensive due to the relatively higher volatility of pre-wet material 20, as compared to viscous material 30. In addition, viscous material 30 typically experiences some loss of its casting solvent as it spreads, exacerbating the problem.

Still referring to FIG. 3, the lack of pre-wet material 20 beneath or adjacent viscous material 30 means that viscous material 30 is spreading across a dry surface 12 of semiconductor wafer 10. This can result in streaks on surface 12 or uneven thickness of material 30, particularly as one approaches an edge 16 of semiconductor wafer 10. In addition, the lack of pre-wet material 20 will retard the spread S of viscous material 30 from axis 14. That is, the rate at which viscous material 30 spreads will decrease upon the loss of pre-wet material 20.

Referring now to FIGS. 4-7, application of a viscous material 130 according to an embodiment of the invention is shown. In FIG. 4, a pre-wet material 120 and viscous material 130 have been applied as in FIG. 2. However, in the depicted embodiment, as or before semiconductor wafer 110 is spun or rotated R about axis 114, additional pre-wet material 122 is applied, e.g., sprayed using a nozzle 140 or similar device, to form a pre-wet pool 124 on surface 112 ahead of spreading viscous material 130.

Semiconductor wafer 110 may be spun or rotated R about axis 114 using any known or later developed device or apparatus suitable for conventional semiconductor spin coating, e.g., a spin coating module employing a spinner motor. Similarly, applying pre-wet material 120 and depositing viscous material 130 atop pre-wet material 120 may employ any known or later developed device or apparatus suitable for conventional semiconductor spin coating. For example, a moveable nozzle connected to a liquid pump via one or more dispensing lines.

Additional pre-wet material 122 may be the same as pre-wet material 120 or may be a different pre-wet material. In some embodiments of the invention, nozzle 140 is moved in a substantially radial path A as viscous material 130 spreads. In other embodiments of the invention, nozzle 140 may be moved in a non-radial path, such as an arcuate or spiral path, as viscous material 130 spreads.

Figure 5:
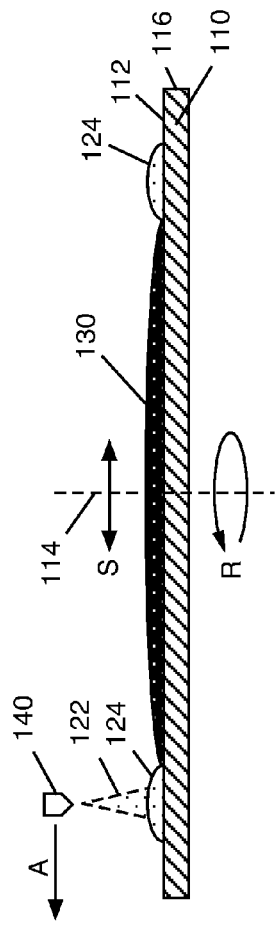
Figure 6:
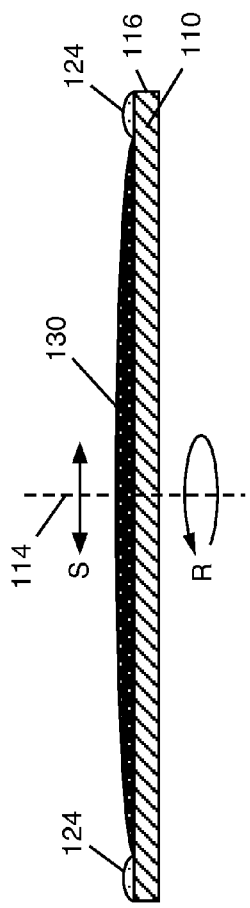
Figure 7:
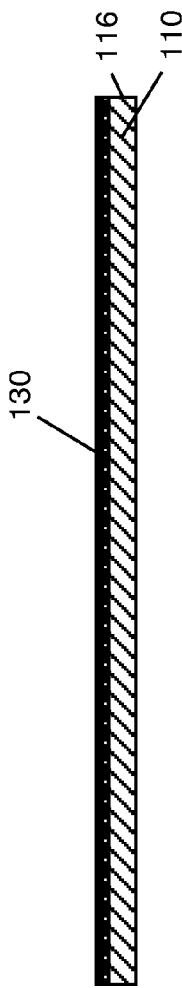

In FIG. 5, nozzle 140 has moved along path A closer to an edge 116 and ahead of spreading viscous material 130, applying additional pre-wet material 122 to continuously maintain pre-wet pool 124. In FIG. 6, pre-wet pool 124 has been continuously maintained along path A, such that pre-wet pool is positioned adjacent edge 116, at which point the application of additional pre-wet material 122 (FIG. 5) may be discontinued. FIG. 7 shows semiconductor wafer 110 after deposition of viscous material 130, which extends to edge 116.

It should be noted that continuously maintaining pre-wet pool 124 may include continuously depositing additional pre-wet material 122. Alternatively, pre-wet pool 124 may be continuously maintained by periodically depositing additional pre-wet material 122.

Figure 8:
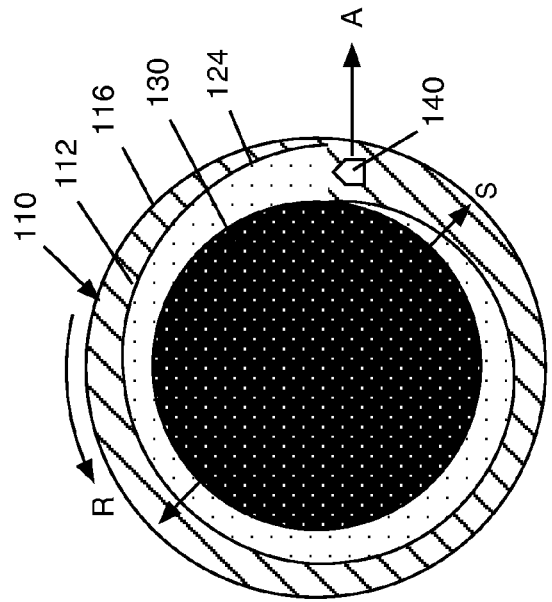
FIGS. 8-9 show top-down views of FIGS. 4-5.
Figure 9:
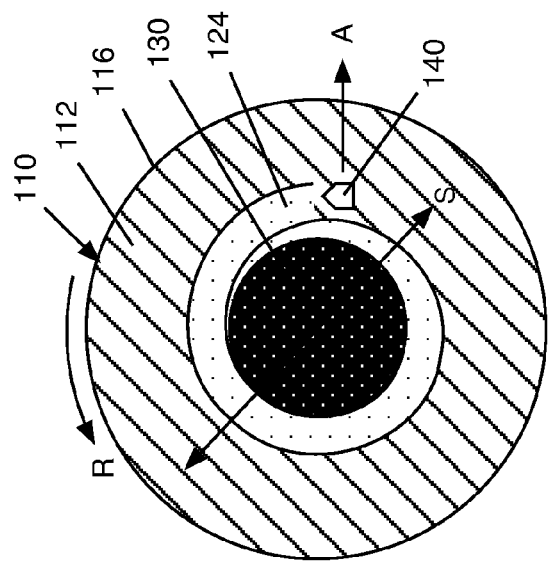

FIGS. 8 and 9 show top-down schematic views of FIGS. 4 and 5, respectively. In FIG. 8, pre-wet pool 124 is deposited ahead of spreading S viscous material 130. Nozzle 140 is moved along substantially radial path A in FIG. 9, continuously maintaining pre-wet pool 124 ahead of viscous material 130.

Figure 10:
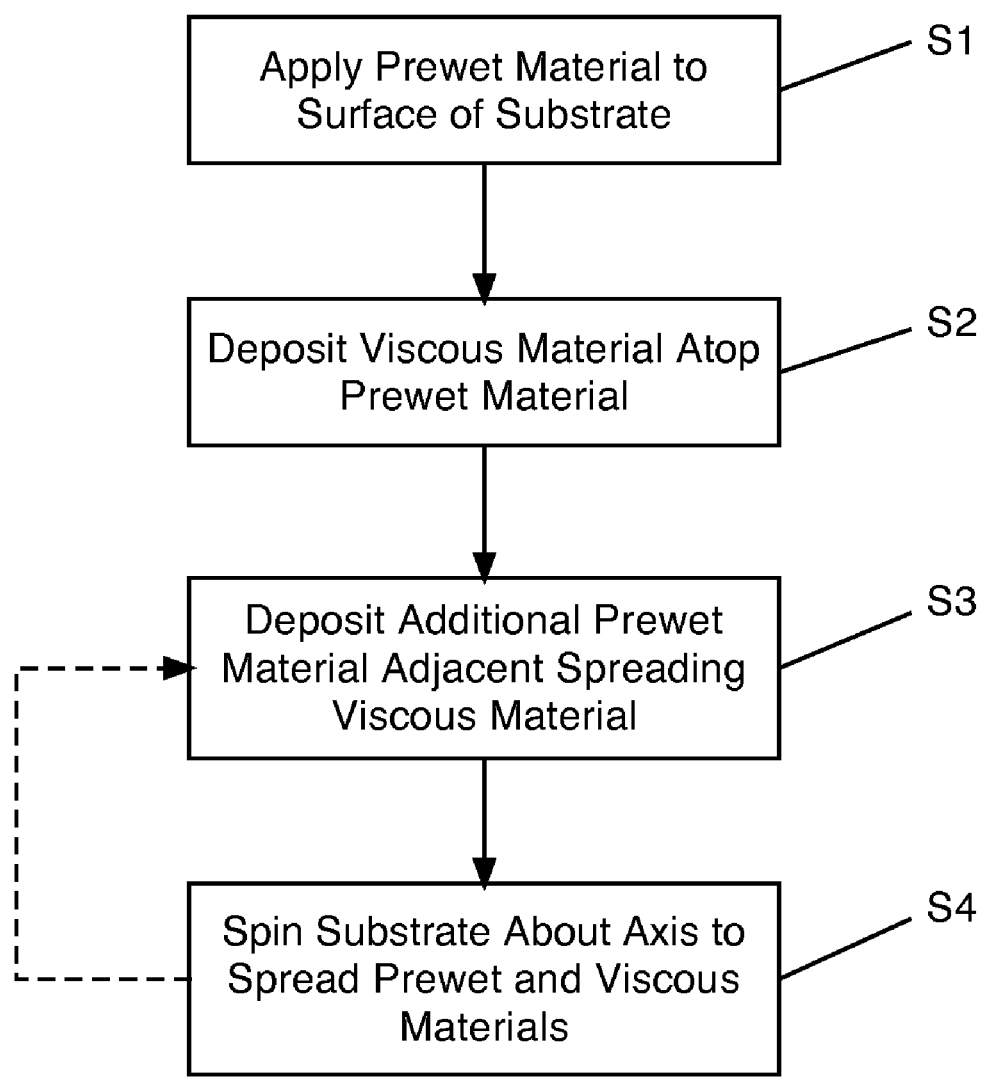
FIG. 10 shows a flow diagram of a method according to an embodiment of the invention.

FIG. 10 shows a flow diagram of a method according to an embodiment of the invention. At S1, a pre-wet material (120 in FIG. 4) is applied to a surface (112 in FIG. 4) of a substrate (110 in FIG. 4). At S2, a viscous material (130 in FIG. 4) is deposited atop the pre-wet material (120).

At S3, additional pre-wet material (122 in FIG. 4) is deposited adjacent the spreading viscous material (130). As used herein, the term "adjacent" is intended to include embodiments in which additional pre-wet material (122) contacts the spreading viscous material (130) directly, as well as embodiments in which additional pre-wet material (122) forms a pre-wet pool (124 in FIG. 4), which in turn contacts the spreading viscous material (130). At S4, the substrate (110) is spun about an axis (114 in FIG. 4) to spread the pre-wet material (120) and viscous material (130) across the surface (112). As noted above, the deposition of additional pre-wet material (122) at S3 may be made before or simultaneous with the spinning of the substrate (110) at S4. As also noted above, the additional pre-wet material (122) deposited at S4 may be continuous or periodic. As such, S3 and S4 may be iteratively looped to continuously maintain a pre-wet pool (124 in FIG. 4) on the surface (112) until the spreading viscous material (130) reaches an edge (116 in FIG. 4) of the substrate (110).

The viscous materials amenable to deposition according to the various embodiments of the invention include, for example, polyamides; particularly photosensitive polyimides (PSPIs) and non-photosensitive polyimides commonly used in final passivation layers. Other viscous materials include polybenzoxazole, benzocyclobutene, poly(p-xylene)polymers (such as parylene), epoxy, an acrylate ester, and a polyamic ester. Other applications of such viscous materials include deep trench via fill and planarization. One skilled in the art will recognize other viscous materials and applications amenable to deposition according to, and which are therefore within the scope of, the various embodiments of the invention.

The viscosity of viscous material 130 (FIG. 4), including the materials mentioned above, is typically about 50 centi-Stokes or higher. Embodiments of the invention are more broadly applicable, however, to combinations of viscosity, wafer size, and spin coating rpm. For example, aspects of the invention may be employed in depositing a first viscous material having a first viscosity on a 300 mm wafer at about 3000-4000 rpm or higher. Aspects of the invention may similarly be employed in depositing a second viscous material having a second viscosity (different than the first viscosity) on a 450 mm wafer at about 3000 rpm or higher. Aspects of the invention may similarly be employed in depositing a third viscous material having a third viscosity (more than the first viscosity) on a 200 mm wafer at about 3000 rpm or higher. One skilled in the art will recognize, of course, that aspects of the invention may be employed in each case to ensure a continuous pre-wet surface ahead of the spreading viscous material.

Similarly, embodiments of the invention may employ any number of pre-wet materials as well as any number of combinations of pre-wet material and viscous material. Examples of pre-wet materials amenable to use in various embodiments of the invention include propylene glycol methyl ether acetate (PGMEA), N-methylpyrrolidone (NMP), and any solvent in which a viscous material may be dissolved. Other pre-wet materials will be apparent to one skilled in the art and are within the scope of the various embodiments of the invention.

Substrates onto which viscous material may be applied according to embodiments of the invention include those materials useful as semiconductor wafer materials. These include, but are not limited to, silicon, silicon oxide, silicon nitride, silicon oxynitride, hafnium silicate, hafnium oxide, zirconium silicate, zirconium oxide, and gallium arsenide. Other materials will be apparent to one skilled in the art.

While the substrate shown in the embodiments above is depicted as having a substantially planar surface, this is not essential. Viscous materials may be applied according to embodiments of the invention to substrates with surfaces having various non-planar features, such as vias.

As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The foregoing description of various aspects of the invention has been presented for purposes of illustration and description. It is not intended to be exhaustive or to limit the invention to the precise form disclosed and, obviously, many modifications and variations are possible. Such modifications and variations that may be apparent to a person skilled in the art are intended to be included within the scope of the invention as defined by the accompanying claims.

What is claimed is:

1. A method of depositing a viscous material on a substrate surface, the method comprising:
    applying a pre-wet material to a surface of a substrate;
    depositing a viscous material atop the pre-wet material;
    rotating the substrate about an axis to spread the viscous material along the surface of the substrate toward a substrate edge; and
    periodically depositing additional pre-wet material in a substantially radial path along the surface to continuously maintain a pre-wet pool adjacent the spreading viscous material.

2. The method of claim 1, wherein the periodically depositing additional pre-wet material includes depositing additional pre-wet material in the substantially radial path along the surface to the substrate edge.

3. The method of claim 1, wherein the viscous material has a viscosity of at least about 50 centi-Stokes.

4. The method of claim 1, wherein the viscous material is selected from a group consisting of: a photosensitive polyimide, a non-photosensitive polyimide, polybenzoxazole, benzocyclobutene, a poly(p-xylene)polymer, epoxy, an acrylate ester, and a polyamic ester.

5. The method of claim 1, wherein the rotating is between about 3000 rpm and about 4000 rpm.

6. The method of claim 1, wherein the pre-wet material and the additional pre-wet material are independently selected from a group consisting of: propylene glycol methyl ether acetate (PGMEA), and N-methylpyrrolidone (NMP).

7. The method of claim 1, wherein the pre-wet material and the additional pre-wet material are the same material.

8. The method of claim 1, wherein the pre-wet material and the additional pre-wet material are different materials.

9. A method of depositing a viscous material on a semiconductor wafer surface, the method comprising:
   applying a pre-wet material to a surface of a semiconductor wafer;
   depositing a viscous material atop the pre-wet material;
   rotating the semiconductor wafer about an axis to spread the viscous material along the surface and toward an edge of the semiconductor wafer; and
   periodically depositing additional pre-wet material in a substantially radial path along the surface to continuously maintain a pre-wet pool adjacent the spreading viscous material.

10. The method of claim 9, wherein the periodically depositing additional pre-wet material includes depositing additional pre-wet material in the substantially radial path to the edge of the semiconductor wafer.

11. The method of claim 9, wherein the substantially radial path along the surface extends to an edge of the semiconductor wafer.

12. The method of claim 9, wherein the viscous material has a viscosity of at least about 50 centi-Stokes.

13. The method of claim 9, wherein the viscous material is selected from a group consisting of: a photosensitive polyimide, a non-photosensitive polyimide, polybenzoxazole, benzocyclobutene, a poly(p-xylene)polymer, epoxy, an acrylate ester, and a polyamic ester.

14. The method of claim 9, wherein the rotating is between about 3000 rpm and about 4000 rpm.

15. The method of claim 9, wherein the pre-wet material and the additional pre-wet material are independently selected from a group consisting of: propylene glycol methyl ether acetate (PGMEA), and N-methylpyrrolidone (NMP).

16. The method of claim 9, wherein the pre-wet material and the additional pre-wet material are the same material.

17. The method of claim 9, wherein the pre-wet material and the additional pre-wet material are different materials.

* * * * *